US012727117B2

(12) United States Patent
Shen

(10) Patent No.: US 12,727,117 B2
(45) Date of Patent: Sep. 1, 2026

(54) WATER-COOLING PUMP COUPLING UNIT

(71) Applicant: ASIA VITAL COMPONENTS CO., LTD., New Taipei City (TW)

(72) Inventor: Ching-Hang Shen, New Taipei City (TW)

(73) Assignee: ASIA VITAL COMPONENTS CO., LTD., New Taipei City (TW)

( * ) Notice: Subject to any disclaimer, the term of this patent is extended or adjusted under 35 U.S.C. 154(b) by 169 days.

(21) Appl. No.: 18/931,224

(22) Filed: Oct. 30, 2024

(65) Prior Publication Data

US 2026/0122847 A1 Apr. 30, 2026

(51) Int. Cl.
*H05K 7/20* (2006.01)

(52) U.S. Cl.
CPC ................................ *H05K 7/20272* (2013.01)

(58) Field of Classification Search
CPC ........... H05K 7/20272; H05K 7/20254; H05K 7/20263
See application file for complete search history.

(56) References Cited

U.S. PATENT DOCUMENTS 9,795,064 B2 * 10/2017 Aoki .................. H05K 7/20772
11,069,595 B2 * 7/2021 Lan ......................... F28D 1/035
11,920,879 B2 * 3/2024 Tokeshi .................. F04D 13/14
11,994,922 B2 * 5/2024 Chen ....................... F25B 21/02
2013/0201628 A1 * 8/2013 Aoki ....................... F28F 9/262 361/699
2014/0069614 A1 * 3/2014 Chiu ....................... F28D 15/00 165/104.19
2016/0338223 A1 * 11/2016 Tsai ........................ F04D 1/003
2017/0235350 A1 * 8/2017 Tsai .......................... G06F 1/20 165/80.4
2019/0326197 A1 * 10/2019 Lan ......................... F28D 1/035

FOREIGN PATENT DOCUMENTS

| | | |
|---|---|---|
| CN | 116149448 A | 5/2023 |
| TW | M317151 U | 8/2007 |
| TW | M586040 U | 11/2019 |
| TW | 202147069 A | 12/2021 |
| TW | M664052 U | 12/2024 |

OTHER PUBLICATIONS

Search Report dated Jul. 24, 2025, issued by Taiwan Intellectual Property Office for counterpart invention application No. 113210668.

* cited by examiner

*Primary Examiner* — Travis Ruby
(74) *Attorney, Agent, or Firm* — Demian K. Jackson; Jackson IPG PLLC

(57) ABSTRACT

A water-cooling pump coupling unit comprises a main body with first, second and third surfaces. The first surface has a first inlet and outlet connected to a water block. The second surface has a first liquid outlet and inlet, as well as a second liquid outlet and inlet connected to multiple pumps. The first liquid outlet and the second liquid inlet are connected via a first connecting hole. The third surface has a second inlet and outlet connected to a radiator. The first inlet and outlet connect to the first liquid outlet and second liquid inlet, respectively. The second outlet and inlet connect to the first liquid inlet and second liquid outlet, respectively. By connecting the water block, the radiator and the pumps with the main body, when one pump malfunctions, the working fluid is driven continuously to circulate between the water block and the radiator by other pump(s).

6 Claims, 9 Drawing Sheets

WATER-COOLING PUMP COUPLING UNIT

BACKGROUND OF THE INVENTION

1. Field of the Invention

The present disclosure relates to a water-cooling pump coupling unit, particularly concerning a water-cooling pump coupling structure for connecting a water block, a radiator and multiple pumps, which allows the working fluid to be driven continuously in circulation. The water-cooling pump coupling structure also increases pressure and reduces water leakage.

2. Description of the Related Art

In the prior art, in order to lower the operating temperature of the heat-generating components inside an electronic device, a heat-absorbing surface of a water block is used for absorbing heat from the heat source. The water block is connected to a pump and a radiator through two tubings respectively. The pump drives and circulates the working fluid (also known as coolant) continuously to absorb heat from the water block and flow to the radiator for heat dissipation.

However, typically, only a single pump is used in the prior art. When the pump malfunctions, the entire system becomes completely inoperable. If the malfunction is not immediately detected and repaired, it can lead to overheating and damage the electronic device. Additionally, using only one pump means that the maximum pressure for driving the working fluid is fixed and cannot be increased further. To increase additional pressure and solve the issue of the entire cooling system shutting down because of using a single pump while it malfunctioned, multiple tubings are connected to multiple pumps in series in the prior art, thereby increasing the pressure and ensuring that other pumps continue to function if one fails.

However, in the prior art, multiple tubings are used to connect all pumps, whether the tubings are in plastic or metal, the tubings tend to have issues of aging and water leakage. The more tubings connected to the pumps, the more potential leakage points there are.

Therefore, how to resolve the above-mentioned problems has become the direction of effort for researchers in this field.

SUMMARY OF THE INVENTION

One of the objectives of the present disclosure is to provide a water-cooling pump coupling unit that allows the working fluid to continue circulating even when one of the pumps fails.

Another objective of the present disclosure is to provide a water-cooling pump coupling unit that can increase the pressure of the working fluid.

Another objective of the present disclosure is to provide a water-cooling pump coupling unit that reduces the number of tubings connecting to the pumps, thereby reducing potential leakage points.

To achieve the above objectives, the present disclosure provides a water-cooling pump coupling unit for connecting a water block, a radiator and multiple pumps. It includes a main body. The front surface of the main body has a first inlet and a first outlet for connecting to the water block. The back surface of the main body has a first liquid outlet, a first liquid inlet, a second liquid outlet and a second liquid inlet. The first liquid outlet and the second liquid inlet are for inserting and connecting to the multiple pumps. The first liquid outlet and the second liquid inlet are connected via a first connecting hole. The side of the main body has a second inlet and a second outlet for connecting to the radiator. The first inlet connects to the first liquid outlet. The first outlet connects to the second liquid inlet. The second outlet connects to the first liquid inlet. The second inlet connects to the second liquid outlet. The water block, the radiator and the pumps are connected through the main body.

Through the design of the present disclosure, when one pump fails, the working fluid can still be driven to circulate between the water block and the radiator continuously by other pump(s). By using multiple pumps, the pressure of the working fluid is increased. The main body replaces the plastic or metal tubings in the prior art to connect to the pumps which effectively addresses the issue of tubing aging and significantly reduces the potential leakage points in the water-cooling system.

BRIEF DESCRIPTION OF THE DRAWINGS

The structure and the technical means adopted by the present disclosure to achieve the above and other objects can be best understood by referring to the following detailed description of the preferred embodiments and the accompanying drawings, wherein.

DETAILED DESCRIPTION OF THE PREFERRED EMBODIMENTS

The aforementioned objectives of the present disclosure, along with its structure and functional characteristics, will be described based on the preferred embodiment in the accompanying diagrams.

Figure 1:
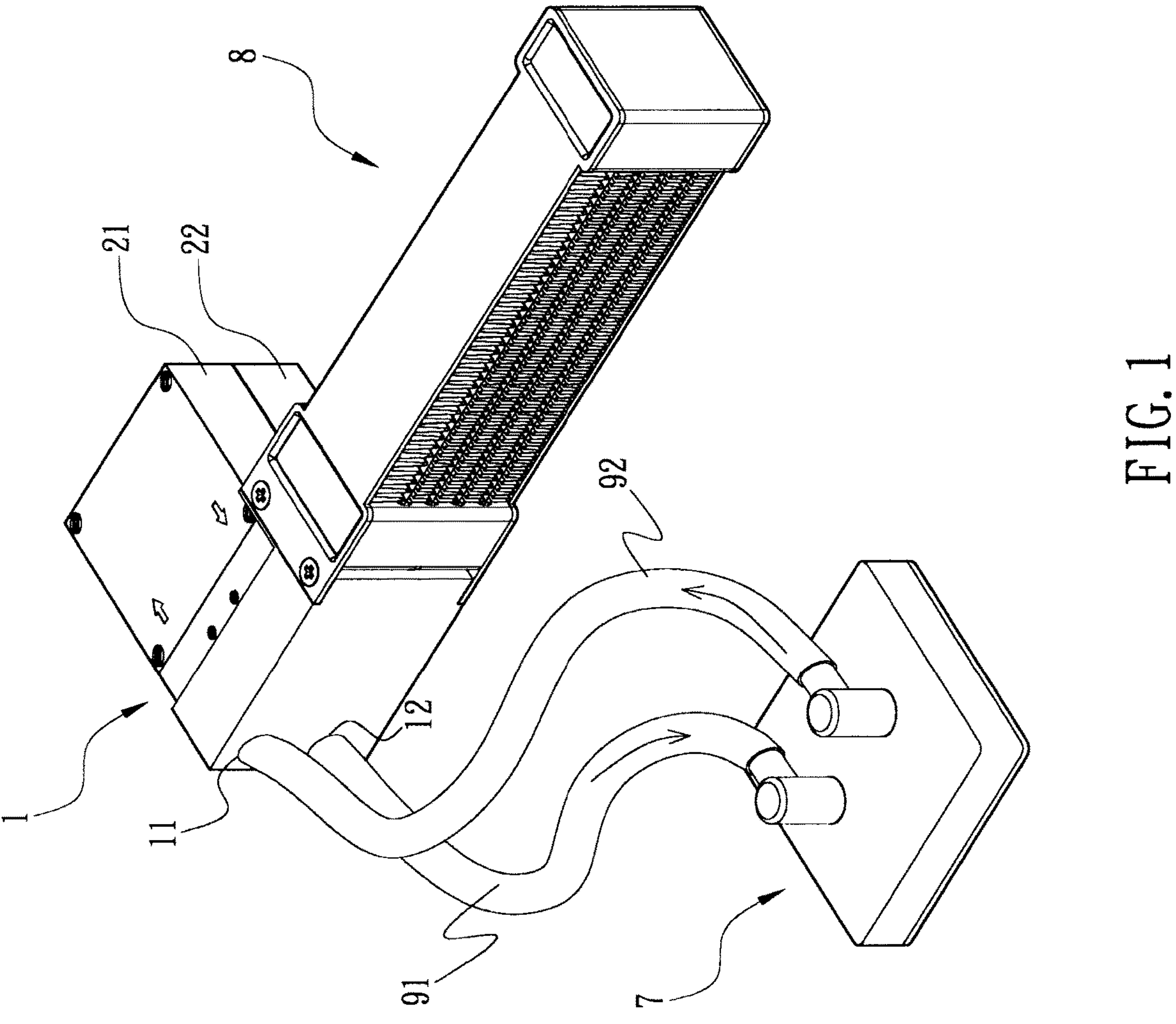
FIG. 1 is a schematic diagram of the assembly of the water-cooling pump coupling unit of the present disclosure connected to a water block, a radiator and multiple pumps.
Figure 2:
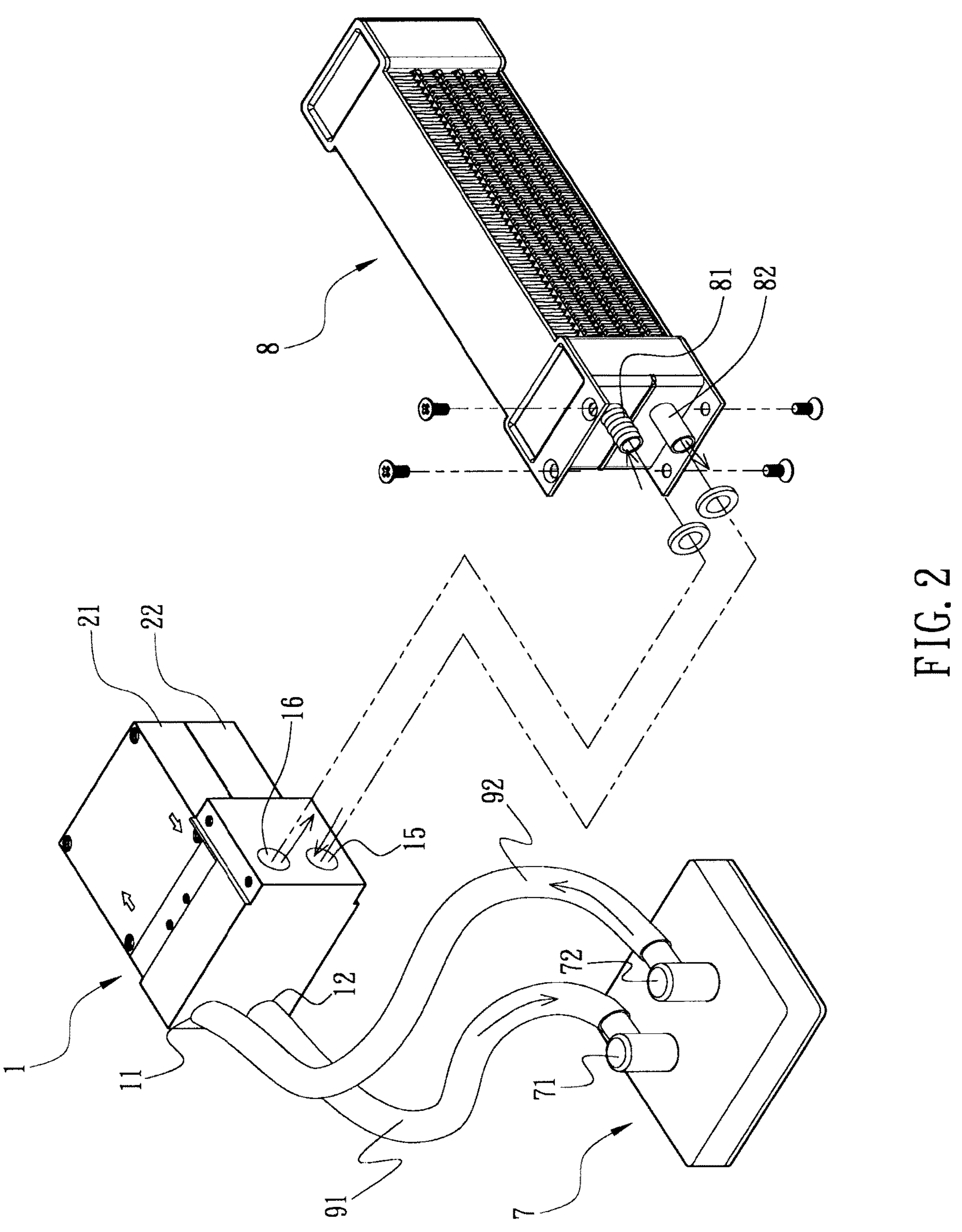
FIG. 2 is an exploded schematic diagram of the coupling between a main body of the present disclosure, and the inlet and outlet of the radiator.

Please refer to FIGS. 1 and 2, which show that the water-cooling pump coupling unit of the present disclosure includes a main body (1) for connecting a water block (7), a radiator (8) and multiple pumps (pump 21 and pump 22). The water block (7) has a water block inlet (71) and a water block outlet (72), which are connected to the main body (1) via tubings (tubing 91 and tubing 92). The radiator (8) has a tubular protruding radiator inlet (81) and a radiator outlet (82) that are inserted into the main body (1). In this way, the multiple pumps (pump 21 and pump 22) drive the working fluid to circulate through the main body (1) between the water block (7) and the radiator (8).

Figure 3:
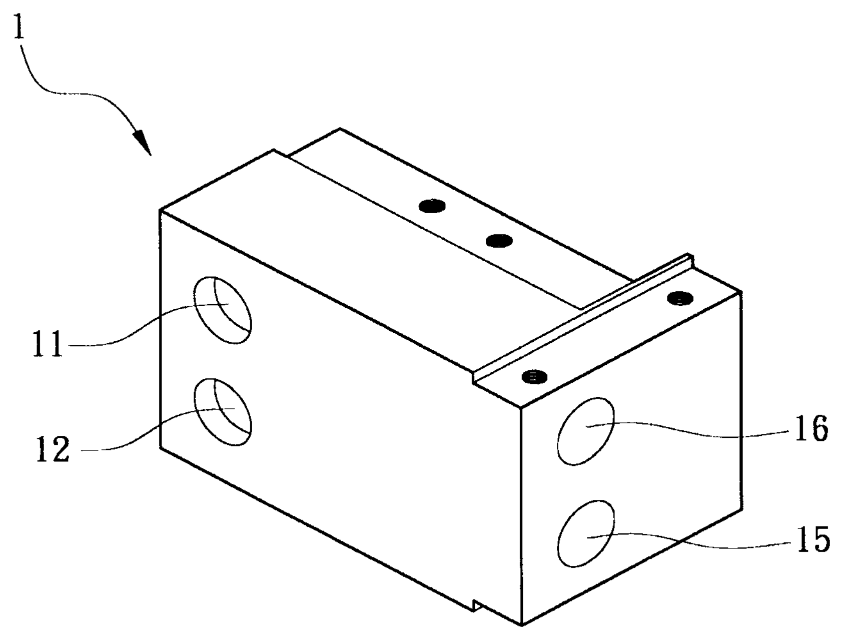
FIG. 3 is a perspective schematic diagram of the water-cooling pump coupling unit of the present disclosure.
Figure 4:
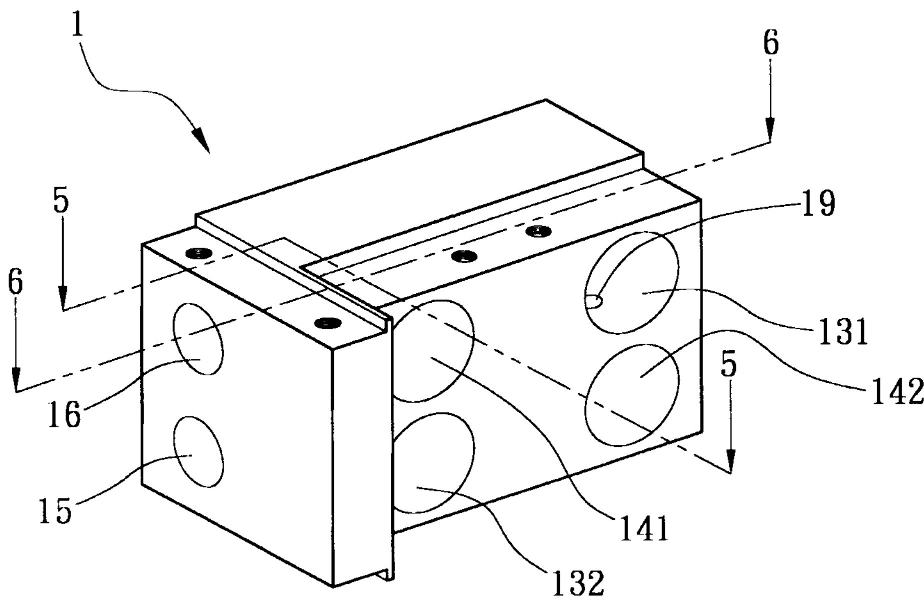
FIG. 4 is a perspective schematic diagram of the water-cooling pump coupling unit of the present disclosure from another angle.
Figure 5:
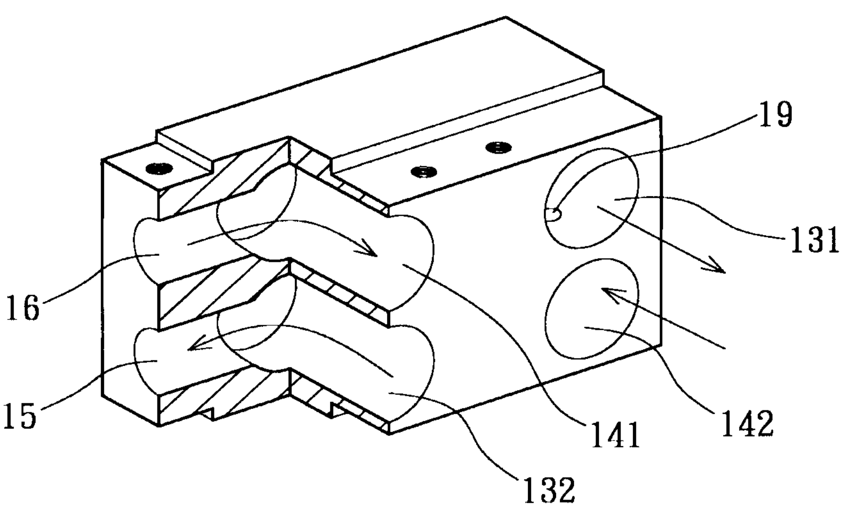
FIG. 5 is a cross-sectional perspective schematic diagram of the water-cooling pump coupling unit of the present disclosure along section 5-5 in FIG. 4.
Figure 6:
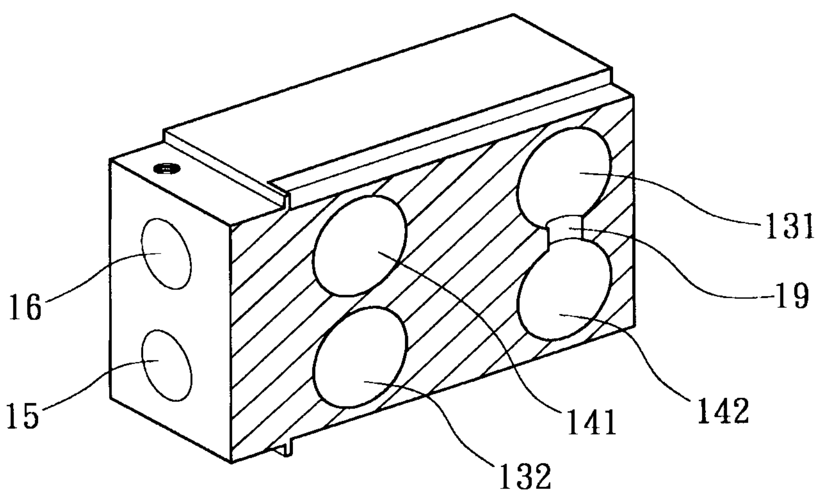
FIG. 6 is a cross-sectional perspective schematic diagram of the water-cooling pump coupling unit of the present disclosure along section 6-6 in FIG. 4.
Figure 7A:
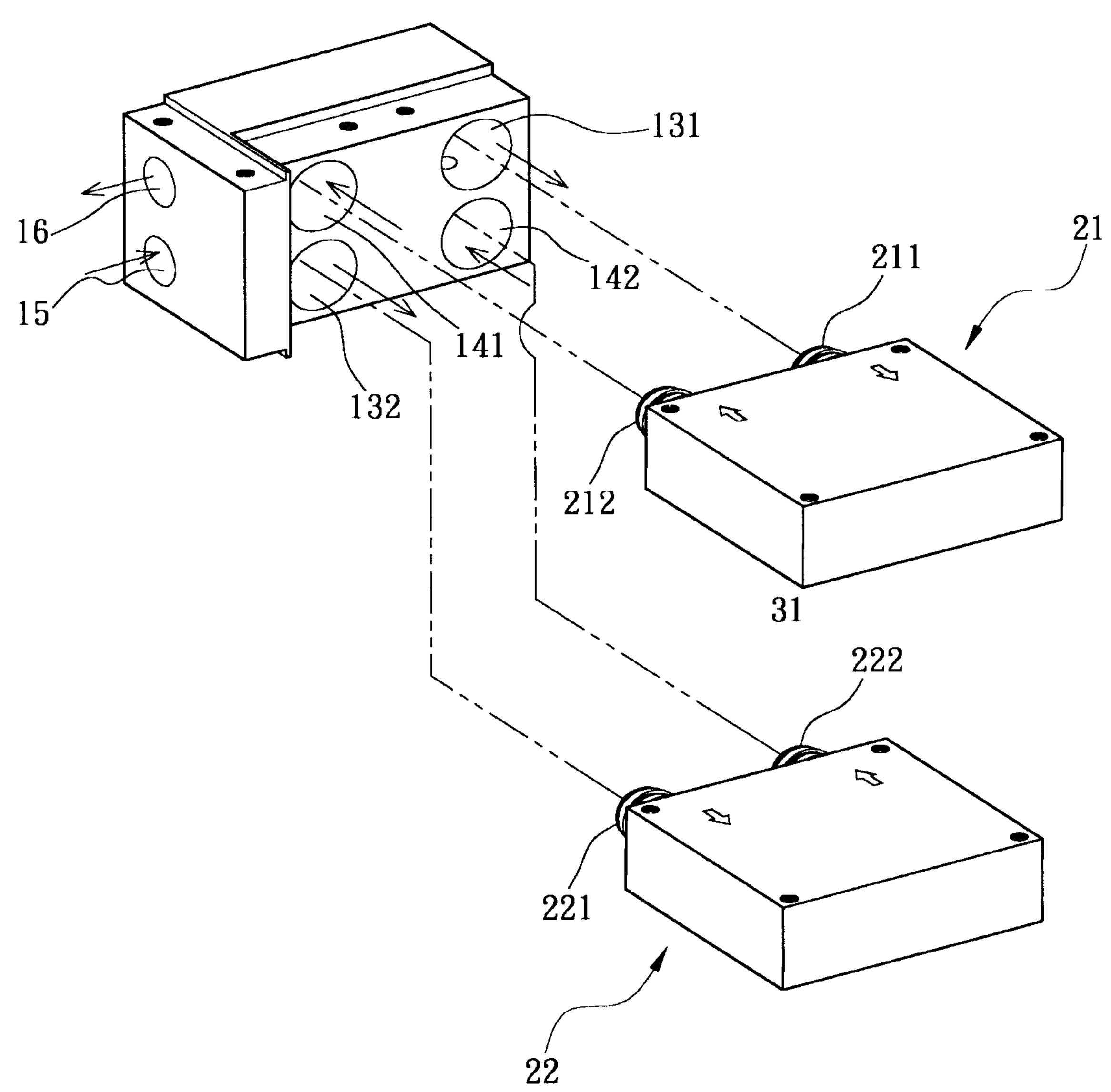
FIGS. 7A and 7B are exploded schematic diagrams of the water-cooling pump coupling unit of the present disclosure being inserted into the pumps.
Figure 7B:
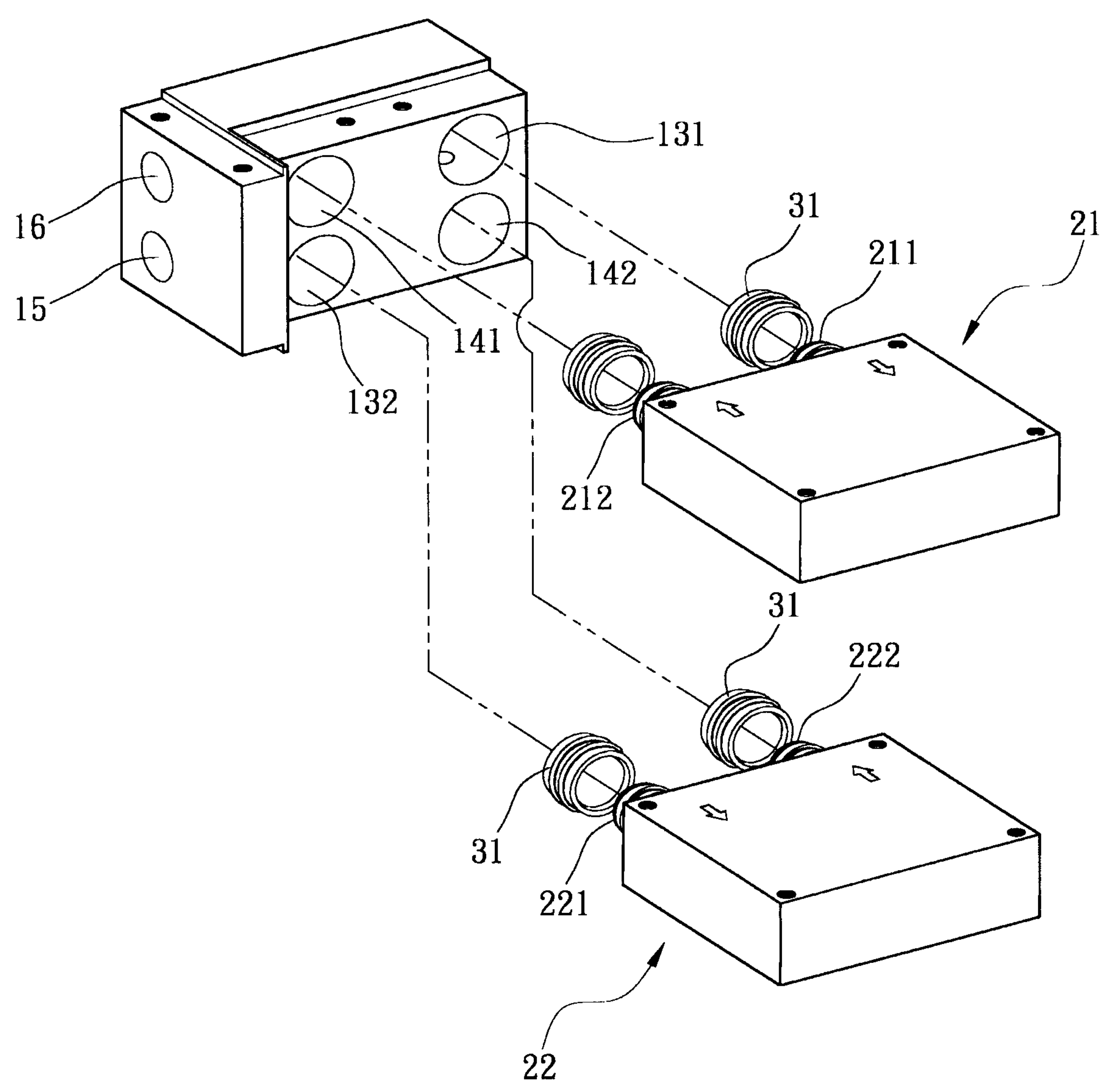

Continuing to refer to FIG. 3, which shows the perspective schematic diagram of the water-cooling pump coupling unit of the present disclosure and FIG. 4 shows the perspective schematic diagram of the water-cooling pump coupling unit from another angle. FIG. 5 is the cross-sectional perspective schematic diagram along section 5-5 of FIG. 4, and FIG. 6 is the cross-sectional perspective schematic diagram along section 6-6 of FIG. 4. FIGS. 7A and 7B are the exploded schematic diagrams of the pumps being inserted into the water-cooling pump coupling unit. As shown in FIGS. 3-6, the water-cooling pump coupling unit includes a main body (1). The front surface (first surface) of the main body (1) has a first inlet (11) and a first outlet (12) arranged in a column (one up and one down). The back surface (second surface) of the main body (1) has a first liquid outlet (131) and a first liquid inlet (141), a second liquid outlet (132) and a second liquid inlet (142) arranged in the two rows (upper and left rows). The side (third surface) of the main body (1) has a second inlet (15) and a second outlet (16) arranged in a column (one up and one down).

In the illustrated embodiment, the first liquid outlet (131) and the first liquid inlet (141) on the back surface of the main body (1) are arranged in the upper or left row, while the second liquid outlet (132) and the second liquid inlet (142) are arranged in the lower or right row (as needed). Additionally, the first inlet (11) and first outlet (12) on the front surface of the main body (1) are connected to the first liquid outlet (131) and second liquid inlet (142), respectively. The second outlet (16) and second inlet (15) on the side of the main body (1) are connected to the first liquid inlet (141) and second liquid outlet (132), respectively. Furthermore, the second liquid inlet (142) is located below the first liquid outlet (131). There is a first connecting hole (19) connecting the second liquid inlet (142) and the first liquid outlet (131).

As described above and shown in FIG. 7A, a first pump (21) and a second pump (22) are stacked in column (one above the other). The first pump (21) has tubular protruding first pump inlet (211) and first pump outlet (212). The first pump inlet (211) and first pump outlet (212) are respectively inserted into the first liquid outlet (131) and first liquid inlet (141) in the upper row, allowing the first inlet (11) on the front surface of the main body (1) to connect to the first pump inlet (211) and the second outlet (16) on the side of the main body (1) to connect to the first pump outlet (212). Similarly, the second pump (22) has tubular protruding second pump inlet (221) and second pump outlet (222). The second pump inlet (221) and second pump outlet (222) are respectively inserted into the second liquid outlet (132) and second liquid inlet (142) in the lower row, allowing the first outlet (12) on the front surface of the main body (1) to connect to the second pump outlet (222) and the second inlet (15) on the side of the main body (1) to connect to the second pump inlet (221). Therefore, if either the first pump (21) or the second pump (22) fails, the working fluid flows through the first connecting hole (19) from one of the first liquid outlet (131) and second liquid inlet (142) into the other, thereby allowing the working fluid to be driven by the functioning pump.

Additionally, as shown in FIG. 7B, the aforementioned first pump inlet (211), the first pump outlet (212), the second pump inlet (221) and the second pump outlet (222) may optionally be fitted with a flexible sealing member (31). The flexible sealing member (31) is a waterproof gasket made of, such as an elastic material (rubber or silicone), having compressible and rebound properties. This allows the flexible sealing member (31) to fill the gaps between the first pump inlet (211) and the first liquid outlet (131), the first pump outlet (212) and the first liquid inlet (141), the second pump inlet (221) and second liquid outlet (132), and the second pump outlet (222) and second liquid inlet (142), forming a complete seal to prevent the working fluid from leaking through these gaps and achieve an effective effect of leakage prevention.

Figure 8A:
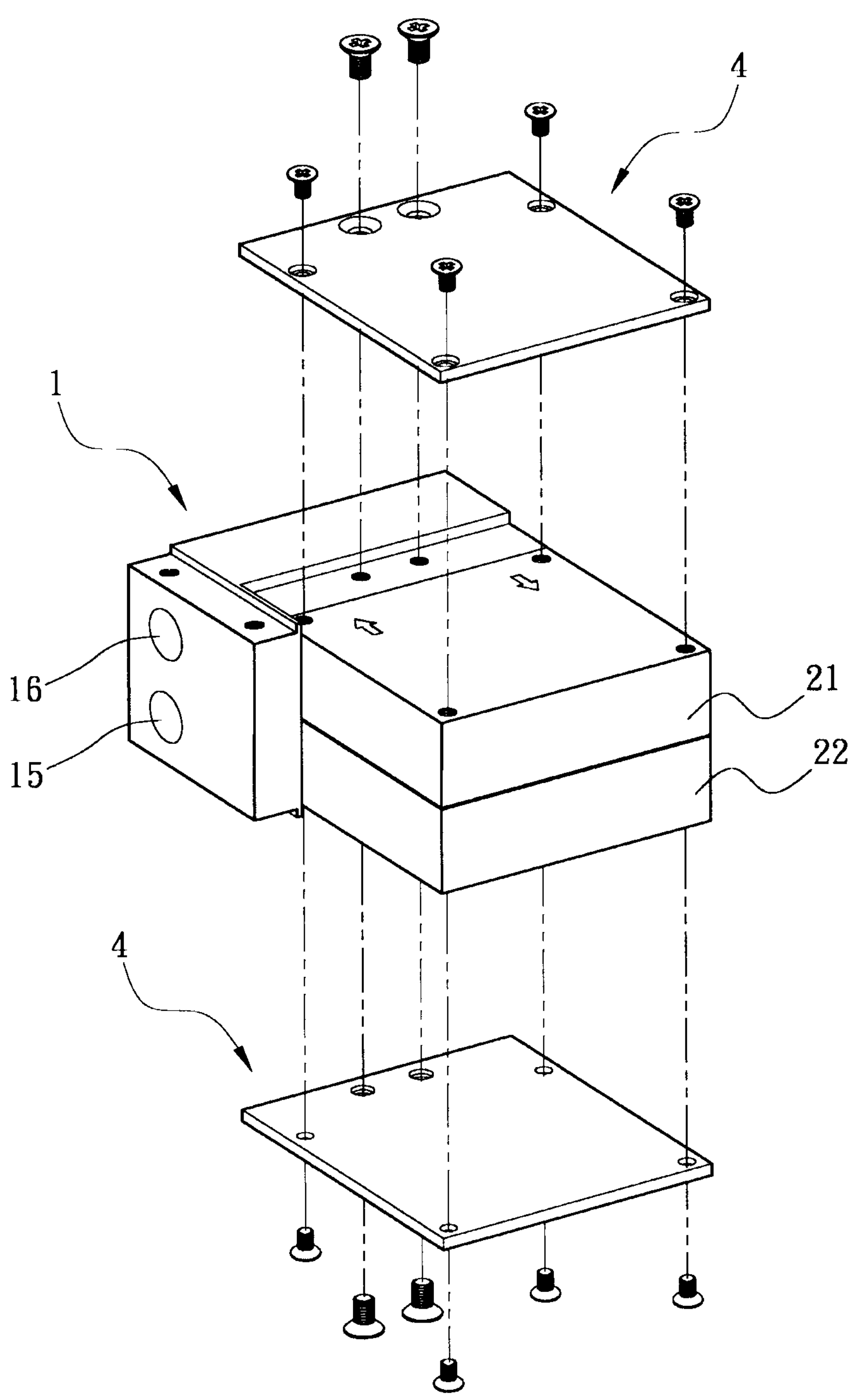
FIGS. 8A and 8B are the schematic diagrams of various implementations of the water-cooling pump coupling unit of the present disclosure with a fixing plate installed.
Figure 8B:
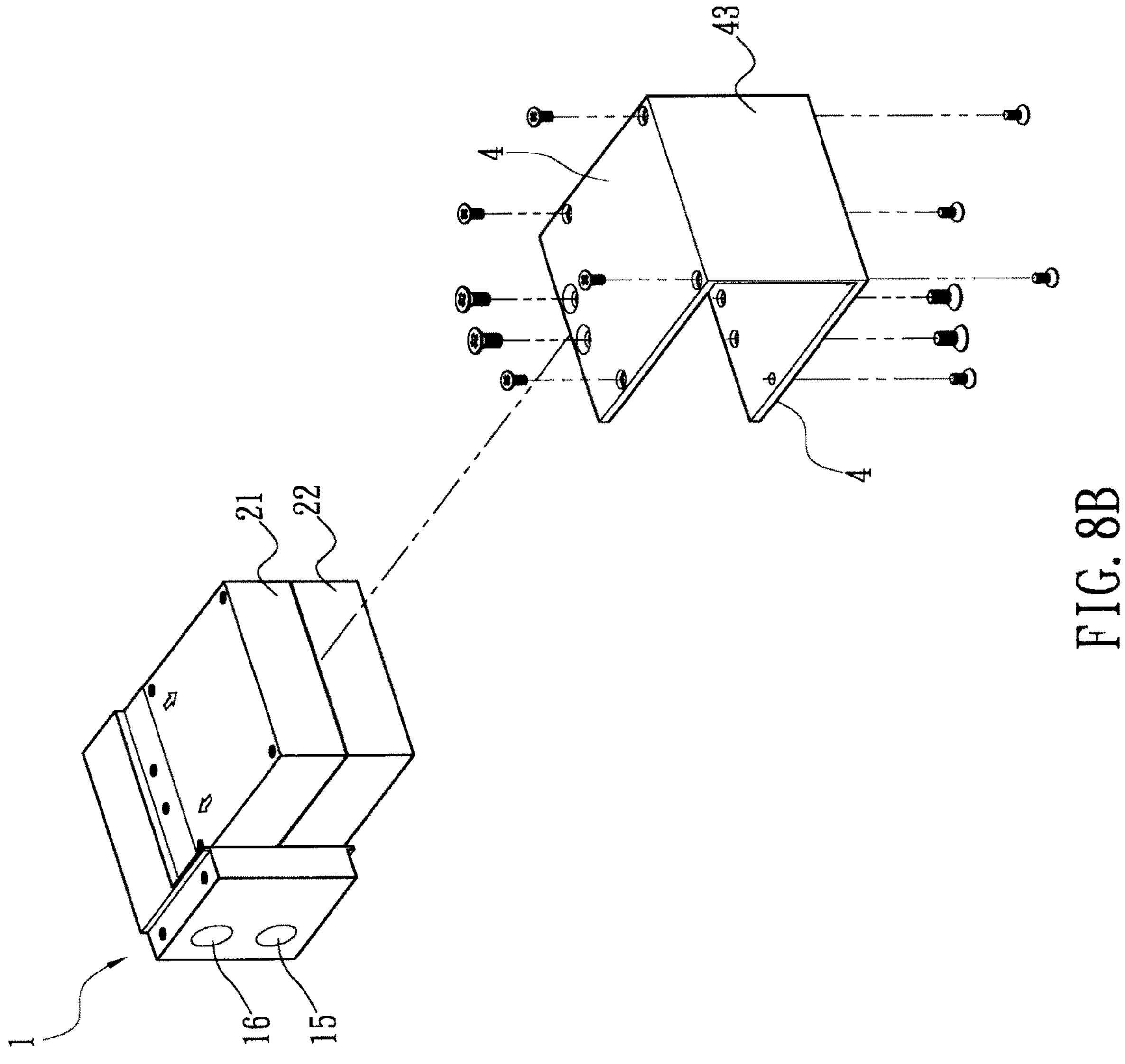

Please refer to FIGS. 8A and 8B, which show the schematic diagrams of various implementations of the water-cooling pump coupling unit of the present disclosure with fixing plates installed. As shown in the diagrams, fixing plates (4) are installed on the upper and lower sides of the main body (1) of the first pump (21) and second pump (22) that are stacked in column (as in FIG. 8A). The main body (1), the first pump (21), the second pump (22) and multiple fixing plates (4) are fixed and connected, for example, by screws, thereby restricting the movement of the first pump (21) and the second pump (22). This ensures that when the first pump (21) and the second pump (22) drive the working fluid, the first pump (21) and the second pump (22) will not detach from the main body (1).

Additionally, the fixing plates (4) on the upper and lower sides may be optionally connected to a backplate (43). The upper and lower ends of the backplate (43) are respectively connected to the upper and lower fixing plates (4), forming a U-shaped fixing member (as in FIG. 8B). The back of the first pump (21) and the second pump (22) abuts against the backplate (43), achieving the same effect as mentioned above.

Figure 9:
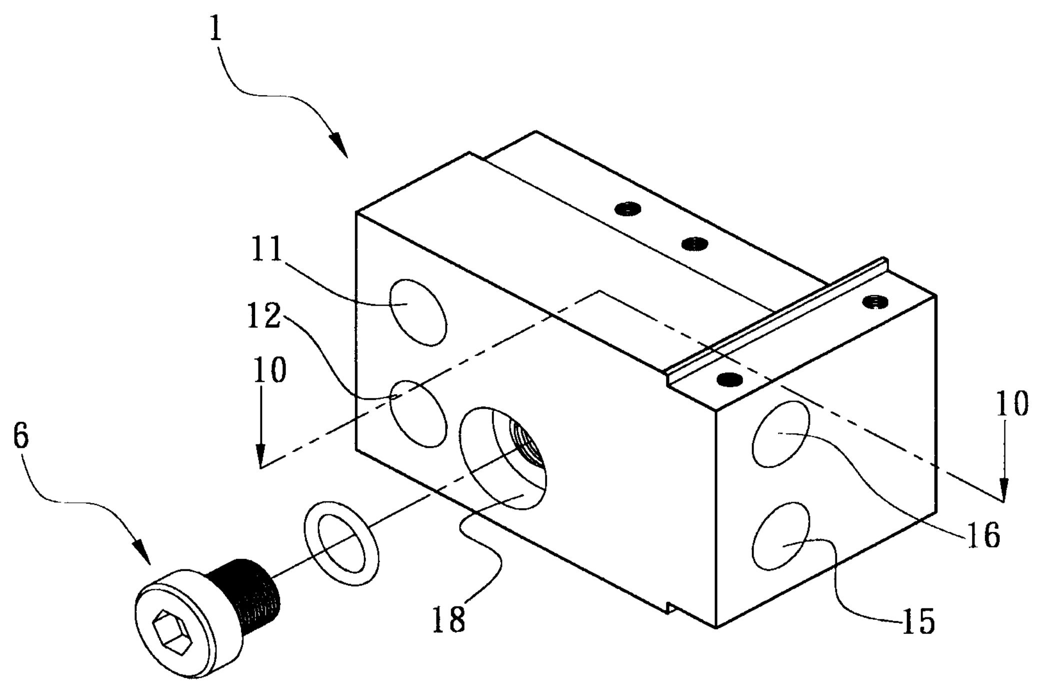
FIG. 9 is a schematic diagram of the water-cooling pump coupling unit of the present disclosure with a filling port.
Figure 10:
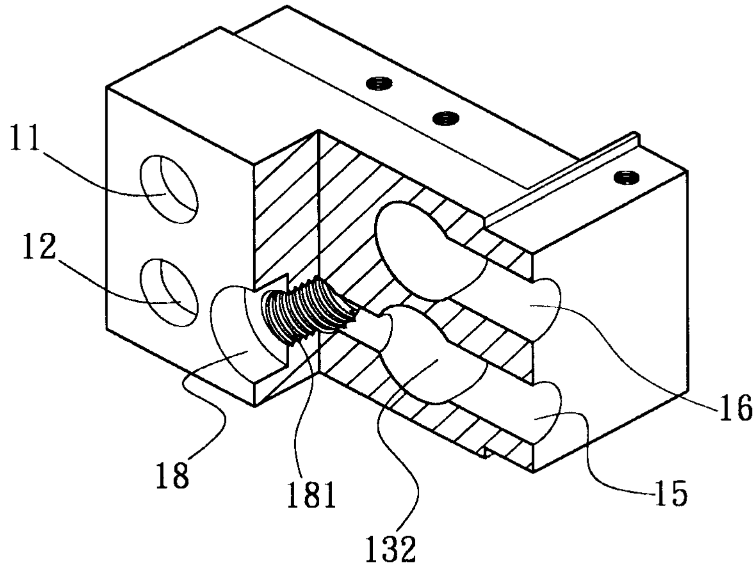
FIG. 10 is a cross-sectional perspective schematic diagram along section 10-10 in FIG. 9.

Please continue to refer to FIGS. 9 and 10, along with FIGS. 3 to 6. The front surface of the main body (1) optionally includes a water filling port (18) for degassing and refilling, which is sealed by a sealing member (6). The filling port (18) connects to any one of the first liquid outlet (131), first liquid inlet (141), second liquid outlet (132) and second liquid inlet (142) on the back surface of the main body (1). In the embodiment, the filling port (18) connects to the second liquid outlet (132).

Referring again to FIGS. 1, 2, 5, and 7A, the arrows in the diagrams represent the flow paths of the working fluid. When both of the first pump (21) and second pump (22) are operating normally, after the working fluid in the water block (7) absorbs the heat from the heat source (not shown), a driving force is generated by the first pump (21) and the second pump (22). The working fluid is transferred from the water block outlet (72) and the tubing (92) to the first inlet (11) of the main body (1). After the working fluid passes through the first liquid outlet (131) and first pump inlet (211) from the first inlet (11) into the first pump (21), the working fluid passes through the first pump outlet (212) into the first liquid inlet (141) of the main body (1). Then the working fluid flows from the second outlet (16) of the main body (1) through the radiator inlet (81) into the radiator (8). The working fluid flows through the internal channels of the radiator (8) to dissipate heat. The cooled working fluid flows via the radiator outlet (82) and the second inlet (15) into the main body (1). The working fluid then continues to flow through the second liquid outlet (132) and second pump inlet (221) into the second pump (22). The working fluid flows through the second pump outlet (222) then enters the second liquid inlet (142) of the main body (1). Finally, the working fluid flows from the first outlet (12) of the main body (1), passes through the tubing (91) and water block inlet (71) and flows into the water block (7).

Furthermore, when either the first pump (21) or second pump (22) malfunctions, the working fluid can flow from the first liquid outlet (131) via the first connecting hole (19) into the second liquid inlet (142) to be driven by the second pump (22) (as shown in FIG. 6), or from the second liquid inlet (142) via the first connecting hole (19) into the first liquid outlet (131) to be driven by the first pump (21) (as shown in FIG. 6). In this way, the working fluid can be driven continuously between the water block (7) and the radiator (8) by other functioning pump(s).

By connecting the multiple pumps (pump 21 and pump 22) with the water block (7) and the radiator (8) through the main body (1) of the present disclosure, even if one of the pumps (pump 21 and pump 22) malfunctions (or fails), the other pump can still keep the working fluid circulating without the need for system shutdown, allowing replacement while maintaining operation. Additionally, these pumps (pump 21 and pump 22) can increase the pressure of the working fluid. Moreover, by replacing the traditional plastic or metal connecting tubings with the main body (1) of the present disclosure, there is no need to worry about the aging of the tubings, thus effectively improving the issue of leakage.

The present disclosure has been described with the above embodiments thereof and it is understood that many changes and modifications in such as the form or layout pattern or practicing step of the above embodiments can be carried out without departing from the scope and the spirit of the present disclosure that is intended to be limited only by the appended claims.

What is claimed is:

1. A water-cooling pump coupling unit for connecting a water block, a radiator and multiple pumps, comprising:

a main body, with a front surface having a first inlet and a first outlet for connecting to the water block;

a back surface having a first liquid outlet, a first liquid inlet, a second liquid outlet, and a second liquid inlet for inserting and connecting to the multiple pumps, the first liquid outlet and the second liquid inlet connected via a first connecting hole; and a side surface having a second inlet and a second outlet for connecting to the radiator, the first inlet connected to the first liquid outlet, the first outlet connected to the second liquid inlet, the second outlet connected to the first liquid inlet and the second inlet connected to the second liquid outlet;

by connecting the water block, the radiator and the multiple pumps through the main body, when one of the multiple pumps malfunctions, working fluid is driven continuously to circulate between the water block and the radiator by the other pumps.

2. The water-cooling pump coupling unit of claim 1, wherein the multiple pumps comprise a first pump and a second pump, the first pump stacked on top of the second pump and having a first pump inlet and a first pump outlet respectively inserted and connected to the first liquid inlet and the first liquid outlet on the back surface of the main body such that the first inlet on the front surface of the main body and the second outlet on the side of the main body are connected to the first pump inlet and the first pump outlet respectively; wherein the second pump has a second pump inlet and a second pump outlet respectively inserted and connected to the second liquid inlet and the second liquid outlet on the back of the main body such that the second inlet on the side of the main body and the first outlet on the front surface of the main body are connected to the second pump inlet and the second pump outlet respectively.

3. The water-cooling pump coupling unit of claim 2, wherein the first pump inlet, the first pump outlet, the second pump inlet, and the second pump outlet are respectively fitted with a flexible sealing member.

4. The water-cooling pump coupling unit of claim 1, wherein a top side and a bottom side of the main body are respectively arranged with a fixing plate.

5. The water-cooling pump coupling unit of claim 4, wherein the fixing plates at the top side and the bottom side are connected to two opposite sides of a backplate, forming a U-shaped fixing member.

6. The water-cooling pump coupling unit of claim 1, wherein the front surface of the main body has a filling port connected to any one of the first liquid outlet, first liquid inlet, second liquid outlet and second liquid inlet on the back surface of the main body, and the filling port is sealed with a sealing member.

* * * * *